United States Patent [19]
Foote et al.

[11] Patent Number: 5,816,052
[45] Date of Patent: Oct. 6, 1998

[54] METHOD AND APPARATUS FOR MECHANICALLY COOLING ENERGY DISPERSIVE X-RAY SPECTROMETERS

[75] Inventors: Steven J. Foote; Jon J. McCarthy, both of Middleton, Wis.

[73] Assignee: Noran Instruments, Inc., Middleton, Wis.

[21] Appl. No.: 805,111

[22] Filed: Feb. 24, 1997

[51] Int. Cl.⁶ ............................................. F25B 19/00
[52] U.S. Cl. ................................ 62/51.1; 250/443.1
[58] Field of Search ................... 62/51.1, 6; 250/443.1

[56] References Cited

U.S. PATENT DOCUMENTS

| | | | |
|---|---|---|---|
| 3,742,729 | 7/1973 | Zulliger . | |
| 3,894,403 | 7/1975 | Longsworth | 62/51.1 |
| 4,312,192 | 1/1982 | Zarudiansky et al. | 62/51.1 |
| 4,361,011 | 11/1982 | Callender et al. . | |
| 4,663,944 | 5/1987 | Bernius et al. | 62/51.1 |
| 4,833,330 | 5/1989 | Swann et al. | 62/51.1 X |
| 4,873,843 | 10/1989 | Volten | 62/51.1 |
| 4,918,929 | 4/1990 | Chudy et al. | 62/51.1 |
| 4,931,650 | 6/1990 | Lowe et al. . | |
| 4,950,901 | 8/1990 | Jones et al. | 62/51.1 X |
| 5,075,555 | 12/1991 | Woldseth et al. . | |
| 5,235,817 | 8/1993 | Gallagher et al. . | |
| 5,274,237 | 12/1993 | Gallagher et al. . | |
| 5,337,572 | 8/1994 | Longsworth . | |
| 5,457,961 | 10/1995 | Longsworth | 62/51.1 |
| 5,531,074 | 7/1996 | Katagiri et al. | 62/6 |
| 5,552,608 | 9/1996 | Gallagher et al. . | |
| 5,615,557 | 4/1997 | Binneberg et al. | 62/51.1 |
| 5,628,195 | 5/1997 | Hill et al. | 62/51.1 |
| 5,628,196 | 5/1997 | Farmer | 62/51.1 |

FOREIGN PATENT DOCUMENTS 2 192091   12/1987   United Kingdom .

OTHER PUBLICATIONS

Brochure entitled "Cryotiger, Technology in Gas Energy Refrigeration", distributed by APD Cryogenics, Inc., P/N 779–026B, Apr. 1995.

Brochure entitled "Freedom, The Revolutionary No–LN Detector From the World Leader in X–Ray Microanalysis", distributed by Noran Instruments, 1994.

Product description brochure entitled "CryoCooled Dewar Option for all Noran Instruments' detectors", distributed by Noran Instruments, 1995.

Handbook entitled "CryoCooled, Option for Noran Instruments Detectors", distributed by Noran Instruments, Dec. 1995, 950A 132107, pp. 1–23.

Brochure entitled "The PRISM Family of Digital X–Ray Detectors", distributed by Princeton Gamma–Tech.

(List continued on next page.)

*Primary Examiner*—Christopher Kilner
*Attorney, Agent, or Firm*—Foley & Lardner

[57] ABSTRACT

An improved X-ray spectrometer detector system includes a mechanical cooling system with a compressor connected by supply and return lines to a cryocooler connected to an X-ray dispersive spectrometer detector for an electron microscope. Within a housing containing a cryocooler heat exchanger, a heat sink thermal mass is thermally connected to a cold finger heat conducting structure which has the X-ray detector mounted at its distal end. The housing insulates the cryocooler heat exchanger and the heat sink from the external ambient. The compressor unit is operated to cool the detector to a desired low operating temperature at which precision measurements may be made. When such measurements are to be made, the compressor is turned off to minimize vibrations that could interfere with X-ray detector measurements or the operation of the electron microscope. The total heat capacity of the thermal mass of the heat sink is sufficient to cause the temperature of the detector to increase gradually while the compressor is turned off to allow a long period of time during which precision measurements may be made without any mechanical vibrations being introduced into the system from active refrigeration. When a temperature of the detector exceeds a higher threshold temperature, the compressor may automatically be turned back on to cool the detector down again to its desired operating range.

18 Claims, 5 Drawing Sheets

OTHER PUBLICATIONS

Brochure entitled "Provisional Launch of the NEW Link Ultracool, maintenance fee detector", distributed by Oxford Microanalysis Group, ASMUC.DOC, Mar. 1995, pp. 1–5.

Brochure entitled "The Kevex Cryoelectric Detector", distributed by the Kevex Corporation.

Product profile entitled "cryoX(™)", distributed by EDAX International.

METHOD AND APPARATUS FOR MECHANICALLY COOLING ENERGY DISPERSIVE X-RAY SPECTROMETERS

FIELD OF THE INVENTION

This invention pertains generally to the field of X-ray detectors and X-ray analysis of materials, and particularly to the cooling of X-ray detectors used in energy dispersive spectrometers for X-ray microanalysis performed on electron microscopes.

BACKGROUND OF THE INVENTION

The interaction of electrons striking the target in an electron microscope produces X-rays which can be analyzed to determine characteristics of the target material, such as chemical composition. To detect these X-rays, a probe is inserted into the vacuum chamber of the electron microscope at a position to intercept X-rays emanating from the target. An X-ray detector is mounted at the tip of the probe, typically formed of lithium-drifted silicon connected to a junction field effect (JFET) transistor, to provide an output signal indicative of the X-rays striking the detector. The solid-state detector and the JFET are typically mounted at the end of a conductive metal cold finger within an outer protective tube of the probe, with an X-ray transparent window closing the end of the probe to protect the detector element and seal off the interior of the tube from the vacuum chamber within the electron microscope. To minimize noise in the signal from the detector, a cooling system of some type is connected to the cold finger outside of the electron microscope to draw heat from the tip of the cold finger and maintain the detector at very low (cryogenic) temperatures, typically below −140° C.

A relatively simple and effective cooling system for X-ray spectrometers utilizes a reservoir of liquid nitrogen into which extends a proximal end of the heat conductive cold finger or a heat conducting extension member connected to the cold finger. The proximal end of the cold finger or extension member is maintained at a temperature no higher than the boiling point of liquid nitrogen and conducts heat away from the distal end of the cold finger to which the X-ray detector is mounted to maintain that detector at a desired temperature. Despite the effectiveness of liquid nitrogen cooling systems, there are a number of disadvantages associated with such systems. These include the cost of purchasing liquid nitrogen, which is constantly consumed during operation of the system, the need to have a liquid nitrogen supply stored on site in a well insulated container, the time and effort required of personnel to replenish the liquid nitrogen in the reservoir connected to the cold finger, and the attendant risk of injury from handling the liquid nitrogen. In addition, as liquid nitrogen boils off within the reservoir connected to the cold finger, it can introduce vibration which can be transmitted through the cold finger to the detector, potentially reducing the sensitivity of the detector.

As an alternative to liquid nitrogen cooling, several cooling systems employing various types of refrigeration cycles have been commercially introduced. These include Peltier cooling systems which utilize Peltier devices to obtain cooling of the cold finger solely by electrical effects, and various types of gas cycle refrigeration systems. While Peltier cooling systems are convenient, they typically are not able to cool the cold finger down to as low a temperature as liquid nitrogen cooling systems can, thus limiting the potential sensitivity of detectors cooled in this manner. Mechanical gas cycle cryogenic coolers have been successfully used to cool X-ray spectrometer detectors down to temperatures as low as those obtainable using liquid nitrogen cooling systems. Mechanical coolers are convenient and relatively cost effective, and they avoid the handling problems associated with liquid nitrogen coolers. Nonetheless, mechanical cryogenic refrigeration coolers also have had limitations. In particular, mechanical coolers introduce vibration into the system, either from the compressor or from the heat exchanger connected to the proximal end of the cold finger. This vibration from the cooler is transmitted to the detector cold finger and thence to the solid-state detector itself. The vibration changes the capacitance of the entire structure, thereby inducing electronic noise into the system which degrades the X-ray peak resolution that can be obtained with the system. Further, the vibration from the cooler can be transmitted to the electron microscope itself, which deteriorates the clarity and resolution in images of the specimens at higher magnifications, for example, above about 30,000 to 40,000 times magnification.

A typical conventional layout for a mechanically cooled X-ray detector system is shown in FIG. 1. An X-ray spectrometer detector 10 includes a probe 11 having a solid-state X-ray detector mounted within an outer tube near the tip 12 of the probe. The probe 11 also includes a heat conductive cold finger (not shown) enclosed within the outer tube. The probe 11 extends from a mobile base unit 14 which is mounted for sliding back-and-forth movement on a mounting bracket 16, so that the probe 11 can be selectively advanced inwardly toward the target within the electron microscope (not shown). A wall 17 of the bracket 16, as shown in FIG. 1, would mount in the wall of the electron microscope so that the portion of the probe 11 extending from the wall 17 extends into the microscope. A cryocooler unit 20 is mounted to the sliding base 14, and an extension 22 of the cold finger extends upwardly from the sliding base 14 into the cryocooler unit 20. Incoming and outgoing gas lines 24 and 25, respectively, extend from a compressor unit 27 to the cryocooler unit 20. A vibration isolating unit 28 may be mounted in the lines 24 and 25 to help minimize transmission of vibrations from the compressor 27 through the lines 24 and 25 to the cryocooler unit 20. In typical installations, the gas lines 24 and 25 may be several feet long so that the compressor unit 27 is situated well away from the electron microscope.

FIG. 2 is a schematic flow diagram for the refrigeration system of FIG. 1. In this typical refrigeration system, a motor driven compressor 30 within the compressor unit 27 compresses the refrigerant gas and passes it through a heat exchanger 31 to cool the gas. The compressed gas then moves through an oil separator 32 to remove oil introduced by the compressor, through a filter dryer 33, thence through the supply gas line 24 to the cryocooler heat exchanger 21 in the cryocooler unit 20, where the gas passes through one side 35 of a regenerative heat exchanger, and thence through a Joule-Thomson throttle 36 which results in expansion and cooling of the gas. The expanded gas then flows through a cold tip heat exchanger 38, to which the proximal end 39 of the cold finger heat conducting structure 22 is attached in heat transfer contact. The gas that passes through the cold tip heat exchanger 38 then passes through the other side 40 of the regenerative heat exchanger, which is coupled to the incoming side 35 of the heat exchanger, and then through the return gas line 25 to the compressor 30 within the compressor unit 27. Refrigeration systems of the type shown in FIG. 2 are available commercially from, for example, APD Cryogenics, Inc. under the trademark "CRYOTIGER".

A partial cross-sectional view of a conventional cryocooler unit 20 is illustrated in FIG. 3. The unit 20 has an outer housing 42 with a cylindrical wall 43, a base wall 44 through which an extension of the cold finger 22 passes, and a top cover wall 45. The cryocooler heat exchanger 21 is mounted within the housing 42 and has its cold end 38 connected to the proximal end 39 of the cold finger heat conducting structure 22, typically through an adapter plate 46 formed of a good heat conductor such as aluminum or copper. The adapter 46 has a central core 47 to which the cold finger heat conducting structure 22 is firmly attached, and the core 47 is firmly attached to the cold end 38 of the heat exchanger 21 to provide good heat transfer between the structures. The adapter 46 may also have a cylindrical cup-like flange 48, typically formed of thin sheet metal. The interior of the housing 42 is maintained under vacuum pressure by connection via, e.g., a fitting 49 to a vacuum pump (not shown).

As can be seen from an examination of these structures, vibrations which originate in the compressor unit 27 may be transmitted through the lines 24 and 25 to the cryocooler heat exchanger 21 and thence through the adapter 46 to the cold finger 22, since these last structures are in firm mechanical contact with one another. The flow of gas through the cryocooler heat exchanger 21, and the expansion of gas from the throttle 36, may also generate vibrations which can be transmitted to the cold finger heat conducting structure 22. As noted above, such vibrations can degrade the maximum sensitivity of the X-ray detector and can affect the performance of the electron microscope itself.

Where very high precision measurements are required, or where measurements are to be taken while the electron microscope is making high magnification images, one way of reducing vibrations which has been utilized is simply to shut off the compressor during the time that measurements are being made. However, this approach has been of limited value since the detector at the tip 12 in such prior systems will reach a temperature above its desired operating temperature within a relatively short time after the compressor is turned off, usually within 15 minutes or less. A significant amount of time is then required while running the compressor to cool the system back down again sufficiently so that new measurements can be made, particularly if the compressor is to be turned off again during these measurements. These limitations of the prior cryocooler systems forced operators to choose a compromise between limited X-ray detector sensitivity or electron microscope image magnification, or repeated short stops and starts of measurements made during cooling off and warming up cycles, with attendant poor time utilization of the electron microscope.

SUMMARY OF THE INVENTION

In accordance with the invention, an improved mechanically cooled energy dispersive X-ray spectrometer detector system utilizes controlled intermittent operation of the cooling system to allow high resolution measurements to be made during periods of time when the refrigeration system is not active. The system is constructed so that the active refrigeration can be turned off for much greater lengths of time than have heretofore been possible, allowing for extended measurements and efficient utilization of the electron microscope with which the spectrometer is utilized. By maintaining the active components of the refrigeration system entirely off during measurement periods, problems associated with mechanical vibrations induced by the refrigeration system are totally eliminated, with the level of cooling system induced vibrations being reduced below that which can be obtained even with conventional liquid nitrogen cooling systems.

The improved cryogenically cooled X-ray spectrometer has a probe which extends into the microscope, with an X-ray detector mounted near the tip of the probe at a distal end of a cold finger heat conducting structure, a mechanical cooler with a cold tip such as a cryocooler heat exchanger which has a fluid circulating therethrough to cool an interface of the heat exchanger to cryogenic temperatures, an enclosure around the cryocooler heat exchanger and a proximal end of the cold finger heat conducting structure, a compressor unit remote from the cryocooler heat exchanger, and supply and return fluid lines extending from the compressor to the cryocooler heat exchanger. The improvement of the present invention comprises a large thermal mass heat sink thermally connected to the cold finger heat conducting structure. The heat sink thermal mass is itself preferably mounted within the insulating enclosure of the cryocooler unit so as to minimize heat conducted from the outside ambient to the heat sink thermal mass.

In operation, when the compressor is active, heat is withdrawn by the cryocooler heat exchanger from both the heat sink thermal mass and from the cold finger heat conducting structure. After a sufficient length of operation of the compressor, the distal end of the cold finger heat conducting structure, on which the X-ray detector is mounted, has reached a temperature below a desired operating temperature for making precision measurements. At this time, the compressor may be turned off. Because the heat sink thermal mass is mounted within the cryocooler enclosure, and is located at a position closer to the cryocooler heat exchanger cold plate, it will have reached a temperature below that of the distal end of the cold finger heat conducting structure and will maintain this temperature differential during operation of the detector. Consequently, any heat transmitted to and absorbed by the cold finger heat conducting structure will be conducted by that structure to the heat sink thermal mass at a rate related to the temperature differential between these structures. Preferably, the total heat capacity of the heat sink thermal mass is significantly greater than the total heat capacity of the cold finger heat conducting structure. Consequently, a significant period of time can elapse before the temperature of the distal end of the cold finger heat conducting structure exceeds the maximum operating temperature of the X-ray detector, in the range of, e.g., 30 minutes to several hours. During this time, because the compressor unit is not operating and no fluid is circulating through the cryocooler heat exchanger, introduction of vibration by the external cooling system is absolutely minimized. No vibration is introduced into the system by virtue of the action of the heat sink thermal mass since the conduction of heat away from the distal end of the cold finger heat conducting structure occurs entirely passively.

In accordance with the present invention, several modes of operation of the spectrometer cooling system are possible. These include conventional modes wherein the cooling system compressor is always running, or manual turn-on and turn-off of the compressor at the choice of the operator. In addition, in the present invention, a preferred mode of operation provides automatic cycling on and off based on the temperature at the detector, with the on-times and off-times not necessarily being equal. A temperature sensor senses the temperature of the cold finger heat conducting structure and a controller utilizes the sensed temperature to control the operation of the compressor until the sensed temperature declines to a lower trip temperature. The compressor is then turned off, allowing high precision measurements to be made. The temperature of the cold finger heat conducting structure will gradually increase until a temperature is sensed by the sensor which is representative of the maximum useful temperature at the detector. At this time, precision measurements may be terminated, and the compressor is turned back on. In a further mode of operation in accordance with the invention, the compressor runs as needed to maintain the sensed temperature such that the detector is maintained at or below the lower trip temperature. The controller is connected to the electron microscope such that when an operator turns on the microscope to take a micrograph of a specimen and/or for focusing and alignment procedures, the compressor is automatically turned off and the cooling system stabilized at the time that the electron microscope is activated to take the micrograph or perform focusing or alignment. The compressor may also be turned off manually by the operator, rather than automatically, when the operator wishes to perform such procedures.

Further objects, features and advantages of the invention will be apparent from the following detailed description when taken in conjunction with the accompanying drawings.

DETAILED DESCRIPTION OF THE INVENTION

Figure 1:
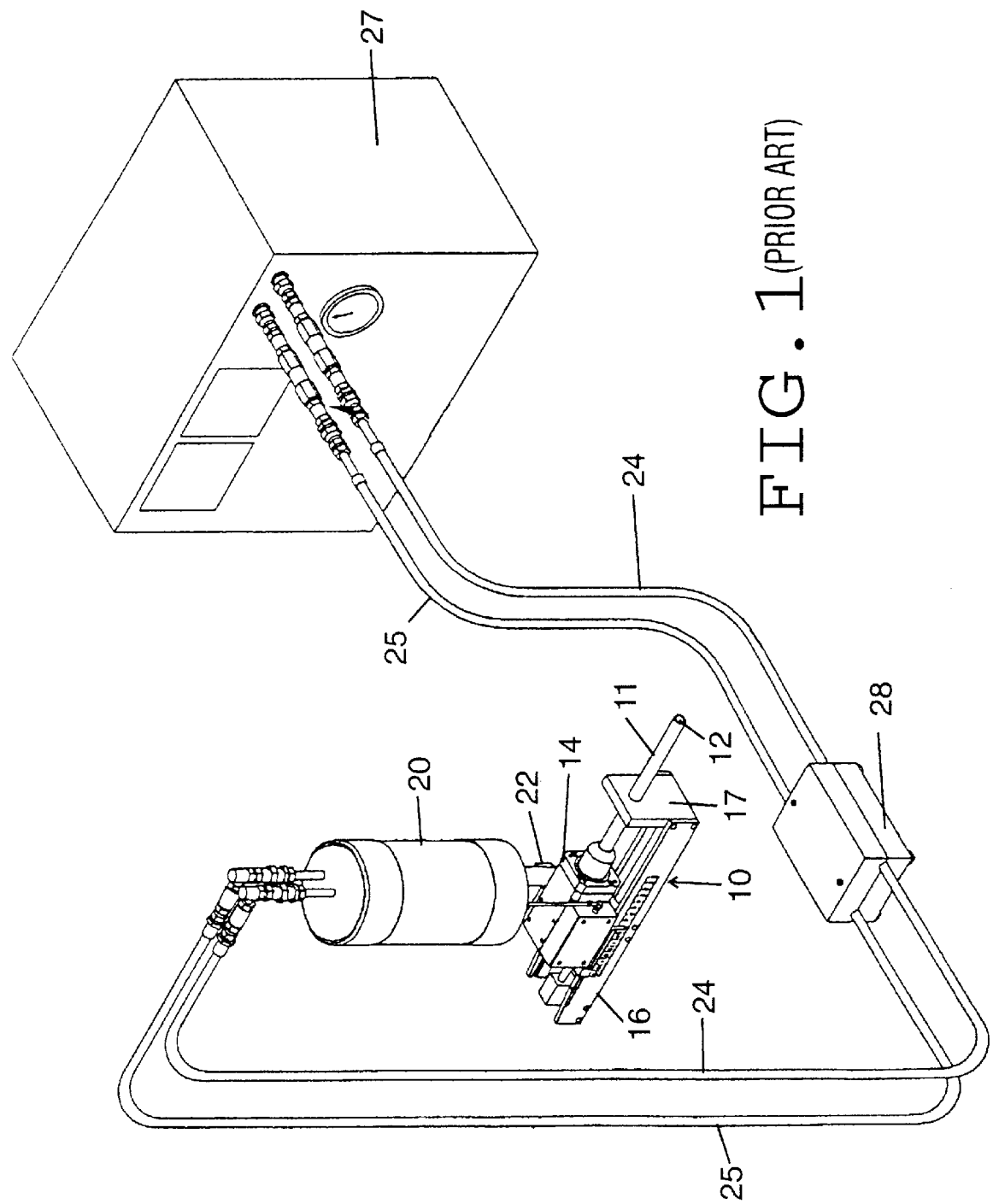
FIG. 1 is a simplified perspective view of a conventional cryogenically cooled X-ray detector system of the type in which the present invention may be incorporated.
Figure 2:
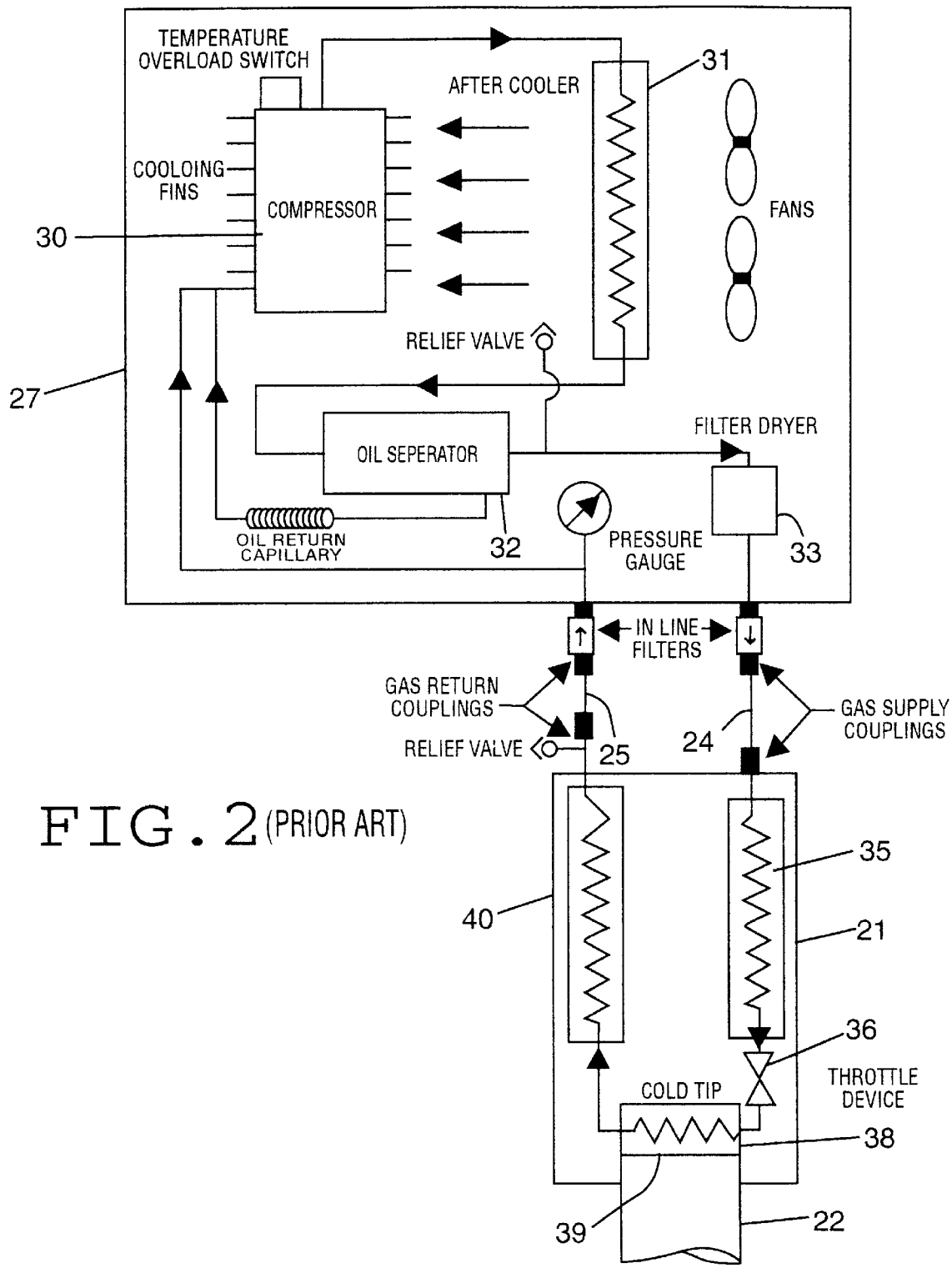
FIG. 2 is a schematic diagram of a conventional gas cycle refrigeration system which may be utilized in conjunction with the present invention.
Figure 3:
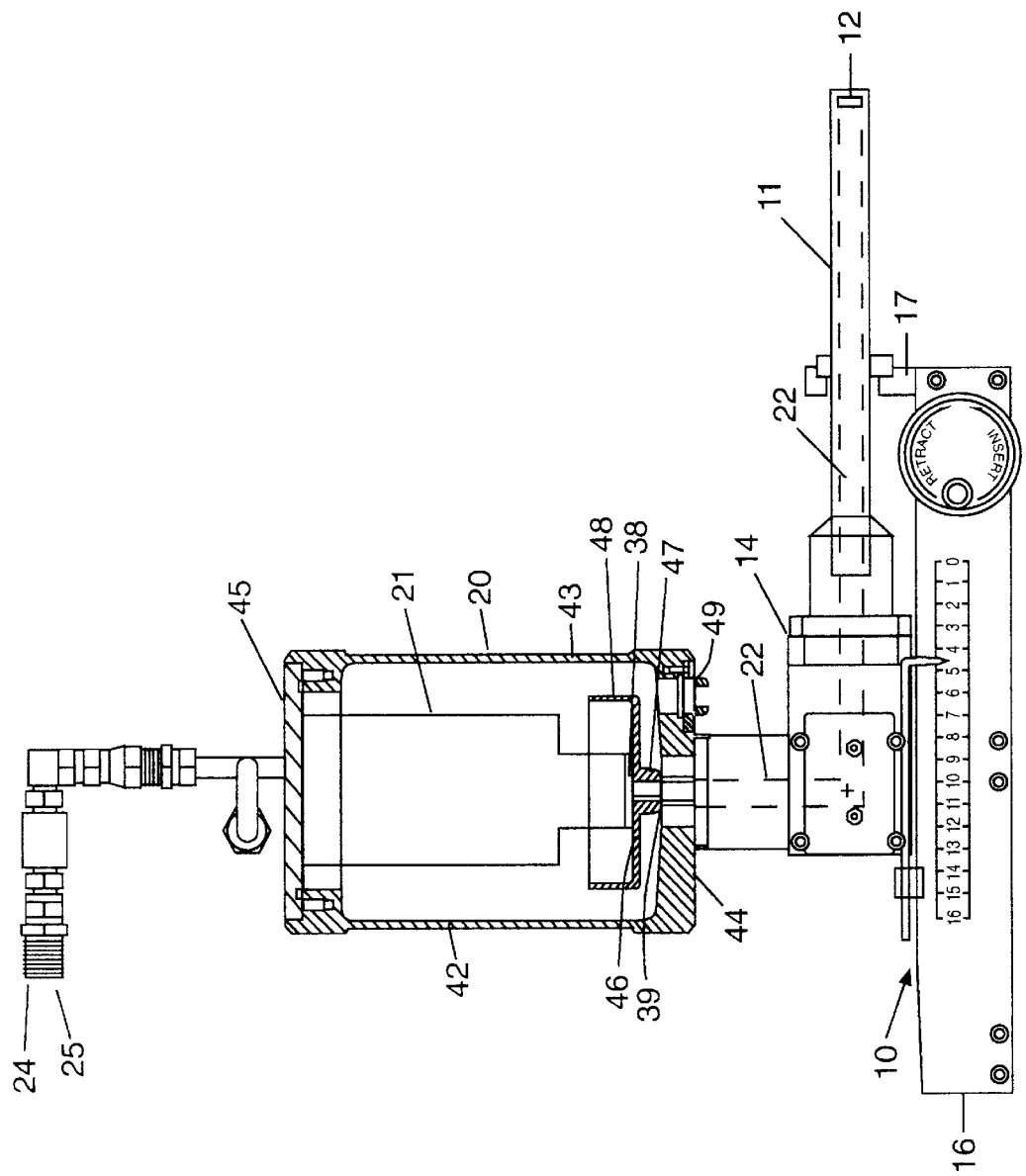
FIG. 3 is a partial cross-sectional view of a cryocooler unit in accordance with the prior art shown connected to an X-ray detector probe.
Figure 4:
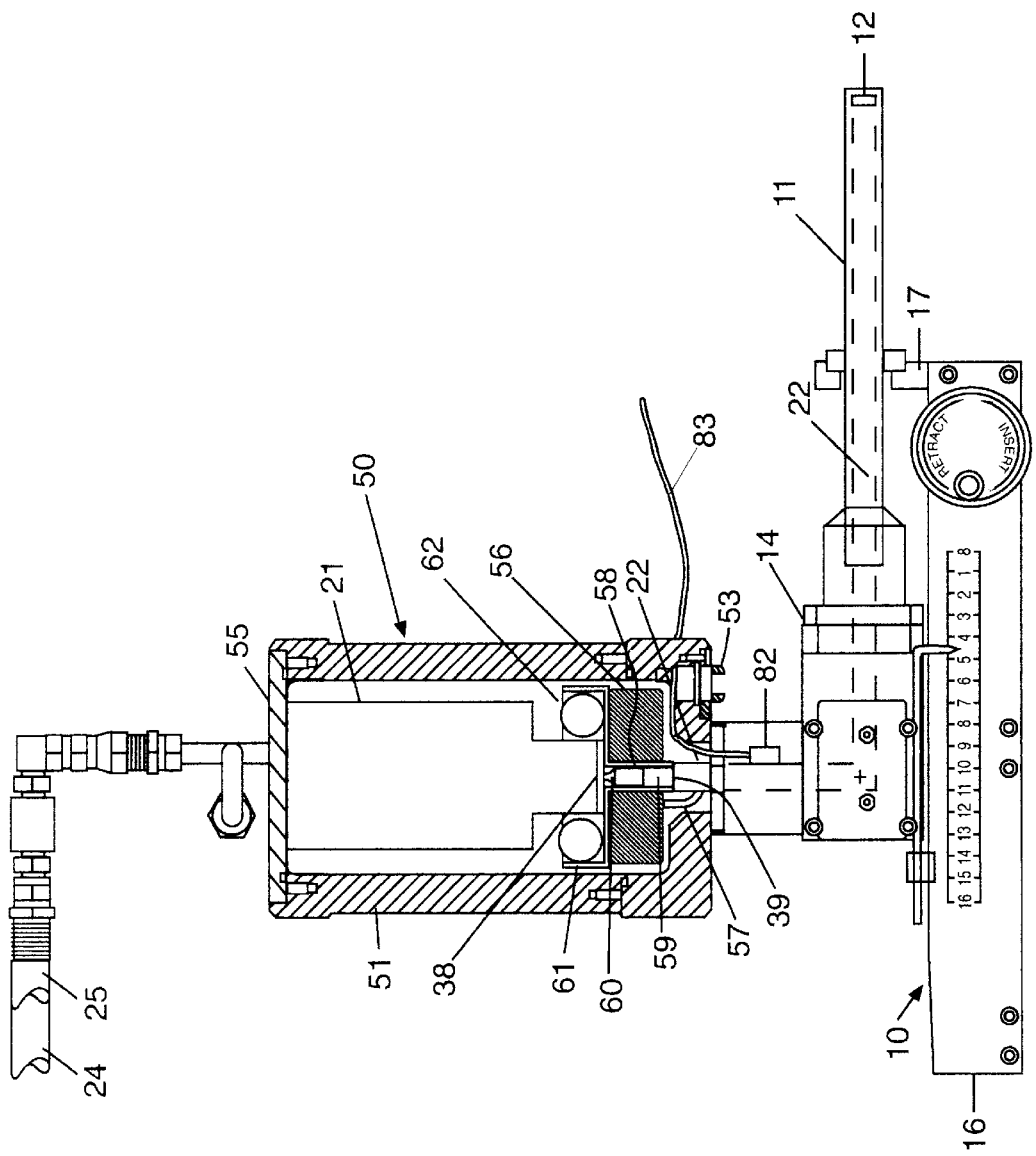
FIG. 4 is a partial cross-sectional view of a cryocooler unit in accordance with the present invention operatively connected to an X-ray detector probe.

With reference to FIG. 4 of the drawings, an improved cryocooler unit in accordance with the present invention is shown in cross-section generally at 50. The cryocooler unit 50 may be utilized in place of the cryocooler unit 20 in the cryogenically cooled X-ray detector system of FIG. 1. The cryocooler unit 50 incorporates a cryocooler heat exchanger 21 therein, which may be a conventional heat exchanger as described above, mounted within a housing 51 formed of a cylindrical side wall 52, a bottom wall 54, and a top cover plate 55. The cylindrical side wall 52, the bottom plate 54 and the top plate 55 may be formed of metal (e.g., aluminum or stainless steel) with highly polished interior surfaces. The interior of the housing 51 is preferably evacuated in a conventional manner to minimize heat transfer from the outside ambient to the interior of the housing 51, e.g., by a vacuum pump (not shown) connected to a fitting 53. If desired, additional insulation, such as aluminized Mylar superinsulation may be wrapped around the heat exchanger 21 within the housing 51.

In accordance with the invention, a heat sink thermal mass 56 is thermally connected to the cold finger heat conducting structure 22, for example, by a copper braid 57 that is thermally connected (as by brazing) to the heat sink thermal mass 56 and to the structure 22. The heat sink thermal mass 56 is preferably formed of a metal having a relatively high thermal conductivity and relatively high heat capacity, such as copper. As shown in FIG. 4, the preferred heat sink 56 is formed as a substantially cylindrical ring of solid metal with a central opening 58. To provide firm mechanical connection between the interfacing structures, as well as tight physical contact to facilitate heat transfer, the proximal end 39 of the cold finger heat conducting structure 22 may have an extension 59 of heat conducting metal attached by a threaded connector 60 to the cold tip 38 of the cryocooler heat exchanger 21 to form a thermal path from the cold tip 38 to the proximal end 39 through the central opening 58 of the heat sink thermal mass. The outer surfaces of the heat sink thermal mass 56 are preferably highly polished to minimize radiative heat transfer. A pan 61 with a charcoal getter pack 62 may be mounted above the thermal mass 56 as shown in FIG. 4.

It is understood that in the present invention the cryocooler heat exchanger 21 and the other components of the cooling system, including the compressor unit 27, the supply and return lines 24 and 25, and the vibration isolator 28, may be conventional or commercially available products (such components of the APD Cryogenics, Inc. CRYOTIGER cooling system). The present invention is not limited to any specific cooling system, but is useful with and may be used with any type of mechanical cooling system, e.g., pulse tube type coolers. Further, it is also understood that the x-ray detector unit 10 may be of conventional construction, such as X-ray detectors sold by Noran Instruments, Inc. and others.

The heat sink 56 preferably has a total heat capacity which is as great as or substantially greater than the total heat capacity of the cold finger heat conducting structure 22 to which it is thermally connected. Because the heat sink 56 is connected to the thermal path between the cold tip 38 and the detector 12 (which is at the distal end of the cold finger heat conducting structure 22) at a position near the cold tip 38, the heat sink 56 will be cooled down to a temperature lower than that of the distal end of the heat conducting structure 22 at the detector 12. A small amount of thermal mass within the heat exchanger 38 will also be in heat conducting communication with the heat sink 56, but this is a much smaller effective thermal mass than that of the cold finger heat conducting structure 22. When the compressor has been turned off and the cold tip 38 of the heat exchanger 21 is not withdrawing heat from the heat sink 56, heat will flow passively by conduction through the cold finger heat conducting structure 22 to the heat sink 56 at a rate related to the relative temperatures of these structures. Because the heat sink 56 is well insulated from the ambient atmosphere by the enclosure 51, the primary source of heat flow to the heat sink 56 will be from the cold finger structure 22. By example only, the heat sink 56 may be formed of copper having a mass of one kilogram (and up to several kilograms), allowing operation of the detector 10 with the compressor off for long periods of time, typically an hour or more. A one kilogram heat sink of copper can generally provide at least an hour of heat transfer from the distal end of the cold finger structure to the heat sink during which the distal end remains below the critical maximum operating temperature, e.g., −140° C.

Figure 5:
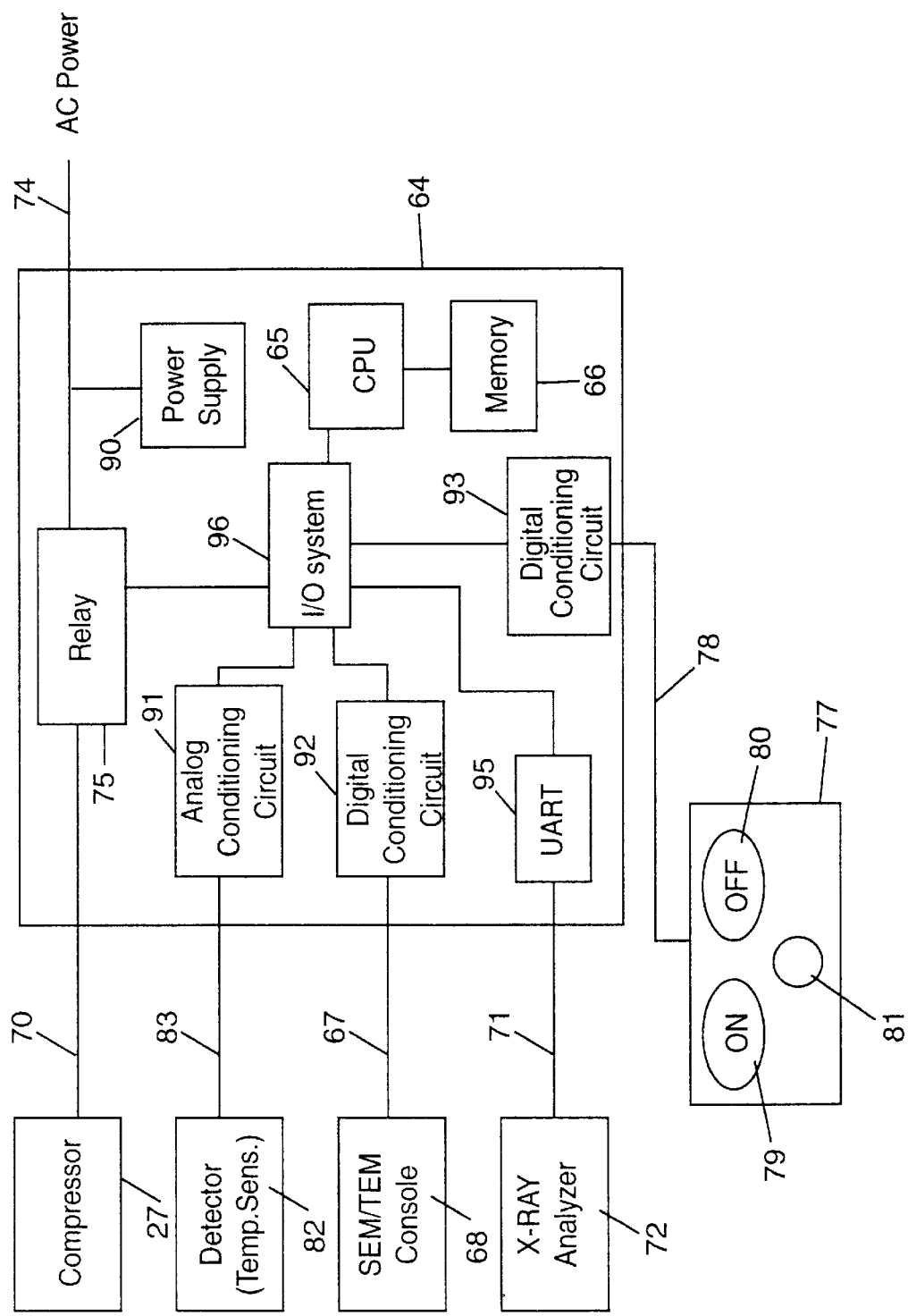
FIG. 5 is a block diagram of a cryocooled X-ray detector and electron microscope system in accordance with the present invention.

A block diagram of the microscope and X-ray detector system of the present invention is shown in FIG. 5. The system is controlled by central controller 64 having a computer CPU 65 therein which operates in accordance with preprogrammed software in a memory 66. The controller 64 is connected by control lines 67 to the console 68 of an electron microscope to control operation of the microscope and focusing, etc. The controller 64 is also connected by a power line 70 to the compressor unit 27 to turn it on and off. The controller 64 is connected by data lines 71 (e.g., RS-232) to an X-ray analyzer 72 of conventional design. The X-ray analyzer 72 is connected in a conventional manner by data and power lines (not shown) to the detector 10 and cooler 50. AC power is provided on lines 74 to the controller which can, for example, thereby control the power provided on the line 70 to the compressor unit 27 by controlling a relay 75 connected between the power line 74 and the line 70 to the compressor unit 27. A remote control module 77 is connected by control lines 78 to the controller 44. The remote control 77 allows manual operation of the compressor unit 27 by an operator at a location remote from the controller 64, and includes an ON button 79, an OFF button 80, and a warning light 81 indicating when the compressor unit 27 is on or off. The controller 64 preferably is programmed such that if the compressor unit 27 is turned off by the operator by pushing the button 80, the controller will automatically turn the compressor unit 27 back on at a selected temperature of the X-ray detector, as determined by a sensor 82; or, if desired, the controller will turn the compressor unit on after a predetermined period of time (e.g., 20 minutes). The sensor 82 is connected by signal lines 83 to the controller 64. The temperature sensor 82 may be mounted on the heat sink 56, or as illustrated in FIG. 4, mounted at a selected position along the cold finger heat conducting structure 22 including at or near the tip 12. The temperature sensor 82 may comprise a variable resistance platinum wire which changes resistance with temperature, with typical variable resistance sensors of this type exhibiting a resistance change from 100 ohms to 1200 ohms over their operating temperature range. The indicator 81 on the remote unit 77 may be, e.g., an LED display which emits light of a color coded to the operation of the unit—for example, with a green output indicating that the compressor unit is on, yellow that the compressor unit is off but the temperature is within the operating range, and red indicating that the unit is off but the detector temperature is outside of the desired operating range.

As further illustrated in FIG. 5, the controller 64 may include conventional functional components for control and interfacing. These include a power supply 90 that converts AC input power to the various DC voltages required by the controller, an analog conditioning circuit 91 that filters, amplifies and converts the analog signal from the temperature sensor 82 to a digital representation of temperature, digital conditioning circuits 92 and 93 that filter the input signals from the electron microscope (SEM and/or TEM) and the remote control box 77 to the proper levels for the digital logic and condition the output signals as necessary to drive the LED display 81 and the SEM/TEM inputs, a UART 95 that converts RS-232 signals to logic level signals for input and output, and an input/output (I/O) circuit 96 that selects the proper input signals requested by the CPU 65 for processing and sets the output values as directed by the CPU.

Using the remote unit 77, the operator can turn off the compressor 27 manually to allow electron microscope images to be taken, to allow focusing or alignment procedures to be carried out, or to do high resolution energy dispersive spectrometry utilizing the detector 10. If the unit is shut off manually, the controller will automatically turn the compressor back on either after a preset period of time has elapsed (e.g., 20 minutes) or if the temperature sensed by the sensor 82 exceeds a preset temperature. In a default mode, the compressor unit 27 is provided with power to run continuously.

Furthermore, in the present invention, the controller 64 is preferably programmed to operate, at the selection of the operator, in an automatic mode. In the automatic mode, the temperature sensed by the sensor 82 is compared to a preselected low threshold temperature. If the temperature at the sensor 82 is not below such a temperature (which is indicative of the temperature at the detector tip 12, for example below the tip temperature by some typical number of degrees where the sensor 82 is not mounted at the tip 12), the compressor unit 27 will be turned on by the controller and will continue to operate until the temperature sensed by the sensor 82 drops below the low threshold. At this time, the controller 64 turns off the compressor unit 27 and high precision electron microscope images or high precision energy dispersive spectrometry can be performed. When the temperature sensed by the sensor 82 then rises above a second, higher selected temperature, which is predetermined to be related to the maximum desired operating temperature at the detector tip 12, the controller 64 turns the compressor 27 back on and provides a signal to the operator indicating that the compressor is on so that further microscope imaging or spectrometry may be deferred. The controller 64 continues to monitor the temperature of the detector 82 and turns the compressor unit 27 back off when the temperature sensed by the sensor 82 drops to or below the first low threshold temperature. In this manner, the temperature at the detector unit 10 is continually cycled within a range between high and low limit temperatures which are within an acceptable range of temperatures for operation of the spectrometer.

Further, the microscope console 68, connected by the lines 67 to the controller 64, provides signals to the controller 64 indicating when the operator has instructed the microscope to image a specimen within the microscope or to perform focusing or alignment procedures. The controller 64 may be controlled to operate in a mode, at the selection of the operator, which normally maintains the compressor 27 operating to keep the temperature at the sensor 82 at or below a low threshold temperature, e.g., the first low temperature threshold indicated above. If desired, some hysteresis in the temperature limits may be provided to avoid rapid cycling on and off of the compressor unit 27. When the operator has instructed the microscope 68 to take an image, the controller may then control the compressor unit 27 to turn off before the microscope operates to take the image. After the image has been completed, and a signal indicative thereof is provided on the lines 67 to the controller 64, the controller may then control the compressor unit 27 to turn back on again to lower the temperature of the detector to or below the desired low threshold temperature.

It is understood that the invention is not confined to the particular embodiments set forth herein as illustrative, but embraces such modified forms thereof as come within the scope of the following claims.

What is claimed is:

1. An improved cryogenically cooled X-ray spectrometer detector of the type having a cold finger heat conducting structure with an X-ray detector at a distal end and a proximal end which is to be cooled, the cold finger heat conducting structure providing a thermal path from its distal end to its proximal end, a heat exchanger cold tip of a mechanical cooler in thermal communication with the proximal end of the cold finger heat conducting structure, and a housing surrounding the heat exchanger cold tip and the proximal end of the cold finger heat conducting structure, the improvement comprising:

a heat sink formed of a thermal mass of good heat conducting solid material which is thermally connected to the cold finger heat conducting structure, the heat sink mounted within the enclosure containing the heat exchanger cold tip and the proximal end of the cold finger heat conducting structure, the thermal mass of the heat sink having a total heat capacity at least as great as the total heat capacity of the cold finger heat conducting structure, the heat sink being cooled by the mechanical cooler heat exchanger when it is operative to a temperature below the temperature of the distal end of the cold finger heat conducting structure so as to conduct heat from the cold finger heat conducting structure to the heat sink when the mechanical cooler heat exchanger is not operative.

2. The improved X-ray spectrometer detector of claim 1 wherein the heat sink is formed as a ring with a central opening through which passes a thermal connection between the heat exchanger cold tip and the proximal end of the cold finger heat conducting structure.

3. The improved X-ray spectrometer detector of claim 2 wherein the heat sink is thermally connected by a braid of conductive metal to the cold finger heat conductive structure.

4. The improved X-ray spectrometer detector of claim 3 wherein the heat sink is formed of copper.

5. The improved X-ray spectrometer detector of claim 1 including a motor driven compressor unit and supply and return fluid lines leading from the compressor unit to a cryocooler heat exchanger within the housing to circulate cooling fluid from the compressor unit through the cryocooler heat exchanger and back to the compressor unit.

6. The improved X-ray spectrometer detector of claim 5 including a temperature sensor operative to sense the temperature of the cold finger heat conducting structure and controller means connected to receive a signal from the sensor and providing control signals to the compressor unit to control the compressor unit to turn on and off in a cycle related to the sensed temperature.

7. The improved X-ray spectrometer detector of claim 6 wherein the controller means controls the compressor unit to turn on when the sensed temperature is at or above a high threshold temperature and to turn off when the sensed temperature is at or below a low threshold temperature.

8. The improved X-ray spectrometer detector of claim 7 further including a manually operated remote control unit connected to the controller, with means thereon for use by an operator for turning the compressor unit on and off at the selection of the operator to override the cycle of turn-on and turn-off of the compressor unit provided by the controller.

9. The improved X-ray spectrometer detector of claim 6 wherein the controller further is connected to an electron microscope to which the detector is mounted to receive signals from the microscope indicating when the microscope is to take an image, the controller responsive to the signals from the microscope to turn off the compressor unit when the microscope has been instructed by an operator to take an image.

10. The improved X-ray spectrometer of claim 9 wherein the controller is further responsive to signals from the microscope to turn off the compressor unit when the microscope has been instructed by an operator to perform focusing or alignment procedures.

11. The improved X-ray spectrometer detector of claim 1 wherein the heat capacity of the heat sink is selected relative to the heat capacity of the cold finger heat conducting structure and to the rate of heat transfer to the cold finger heat conducting structure such that when the temperature of the detector is below a low threshold temperature which is a selected number of degrees below the maximum operating temperature of the detector, the rate of flow of heat from the cold finger heat conducting structure to the heat sink will be such that the temperature of the detector will remain below the maximum operating temperature for at least one hour.

12. A method of cooling an X-ray spectrometer detector of the type having a cold finger heat conducting structure with an X-ray detector at a distal end and a proximal end which is to be cooled, the cold finger heat conducting structure providing a thermal path from its distal end to its proximal end, and a heat exchanger with a cold tip interfaced to the cold finger heat conducting structure to draw heat therefrom, comprising the steps of:

(a) thermally connecting a heat sink formed of a thermal mass of solid material to the cold finger heat conducting structure, wherein the thermal mass of the heat sink has a total heat capacity at least as great as the total heat capacity of the cold finger heat conducting structure;

(b) operating the heat exchanger to cool the heat sink to a temperature below the temperature of the distal end of the cold finger heat conducting structure; and (c) discontinuing operation of the heat exchanger and conducting heat from the cold finger heat conducting structure to the heat sink.

13. The method of claim 12 wherein the step of operating the heat exchanger comprises providing a motor driven compressor unit and supply and return fluid lines leading from the compressor unit to the heat exchanger and operating the compressor unit to circulate cooling fluid from the compressor unit through the heat exchanger and back to the compressor unit.

14. The method of claim 13 including the step of sensing the temperature of the cold finger heat conducting structure and controlling the compressor unit to turn on and off in a cycle related to the sensed temperature.

15. The method of claim 14 wherein in the step of controlling the compressor unit, the compressor unit is turned on when the sensed temperature is at or above a high threshold temperature and turned off when the sensed temperature is at or below a low threshold temperature.

16. The method of claim 12 further including the steps of providing an electron microscope to which the detector is mounted, receiving signals from the microscope indicating when the microscope is to take an image, and responding to the signals from the microscope to turn off the compressor unit when the microscope has been instructed by an operator to take an image.

17. The method of claim 16 further including the steps of responding to signals from the microscope indicating when the microscope is to perform focusing or alignment procedures to turn off the compressor unit.

18. The method of claim 16 further including the steps of sensing the temperature of the cold finger heat conducting structure, and after the compressor unit has been turned off in response to the signals from the microscope, turning the compressor unit back on when the sensed temperature exceeds a maximum threshold temperature.

* * * * *